(12) United States Patent
Matsuda

(10) Patent No.: US 6,476,427 B2
(45) Date of Patent: Nov. 5, 2002

(54) MICROWAVE MONOLITHIC INTEGRATED CIRCUIT AND FABRICATION PROCESS THEREOF

(75) Inventor: Hajime Matsuda, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/776,722

(22) Filed: Feb. 6, 2001

(65) Prior Publication Data

US 2001/0012652 A1 Aug. 9, 2001

(30) Foreign Application Priority Data

Feb. 8, 2000 (JP) .......................... 2000-030818

(51) Int. Cl.$^7$ .................. H01L 29/80; H01L 31/112; H01L 27/095; H01L 31/07
(52) U.S. Cl. .................. 257/267; 257/275; 257/280; 257/472; 257/473
(58) Field of Search .................. 257/267, 275, 257/280, 472, 473, 486, 482, 249, 364, 366

(56) References Cited

U.S. PATENT DOCUMENTS

| | | | | |
|---|---|---|---|---|
| 4,845,534 A | * | 7/1989 | Fukuta | 257/283 |
| 5,204,278 A | * | 4/1993 | Imamura et al. | 438/183 |
| 5,405,792 A | * | 4/1995 | Nogami et al. | 438/174 |
| 5,550,065 A | * | 8/1996 | Hashemi et al. | 148/DIG. 100 |
| 5,929,473 A | * | 7/1999 | Nishihori et al. | 257/277 |
| 6,060,734 A | * | 5/2000 | Kunihiro | 257/284 |
| 6,078,071 A | * | 6/2000 | Matsuda | 257/280 |
| 6,114,195 A | * | 9/2000 | Nishihori et al. | 438/180 |
| 6,144,066 A | * | 11/2000 | Claverie | 257/133 |
| 6,262,460 B1 | * | 7/2001 | Kalnitsky et al. | 257/402 |
| 6,274,889 B1 | * | 8/2001 | Ota et al. | 257/12 |
| 6,329,677 B1 | * | 12/2001 | Oguri et al. | 251/194 |
| 6,342,712 B1 | * | 1/2002 | Miki et al. | 257/295 |

FOREIGN PATENT DOCUMENTS

| | | |
|---|---|---|
| JP | 62-46551 | 2/1987 |
| JP | 2-207563 | 8/1990 |
| JP | 5-121458 | 5/1993 |
| JP | 7-22310 | 1/1995 |

* cited by examiner

Primary Examiner—John F. Niebling
Assistant Examiner—Walter Lindsay
(74) Attorney, Agent, or Firm—Armstrong Westerman & Hattori, LLP

(57) ABSTRACT

A microwave monolithic integrated circuit comprises a T-shaped gate electrode including a Schottky gate electrode formed on a first region of a compound semiconductor substrate, a pair of ohmic electrodes making an ohmic contact with a surface of the substrate in the first region at respective sides of the T-shaped gate electrode, a lower capacitor electrode pattern formed on a second region of the compound semiconductor substrate with a composition substantially identical with a low-resistance, top electrode constituting the T-shaped gate electrode on the Schottky gate electrode, a dielectric film formed on the lower electrode pattern, and an upper electrode pattern formed on the dielectric film.

7 Claims, 12 Drawing Sheets

MICROWAVE MONOLITHIC INTEGRATED CIRCUIT AND FABRICATION PROCESS THEREOF

CROSS-REFERENCE TO RELATED APPLICATION

The present application is based on Japanese priority application No.2000-30818 filed on Feb. 8, 2000, the entire contents of which are hereby incorporated by reference.

BACKGROUND OF THE INVENTION

The present invention generally relates to semiconductor devices and more particularly to a high-speed semiconductor device having a low-resistance self-aligned gate electrode and a fabrication process thereof.

Compound semiconductor devices are semiconductor devices that use a compound semiconductor material such as GaAs for a channel region thereof. Thus, compound semiconductor devices have excellent high-frequency operational characteristics and are used extensively for high frequency or ultrahigh-frequency amplifiers in various electronic apparatuses including cellular phones in the form of MMIC (microwave monolithic integrated circuit), in which the compound semiconductor devices are integrated together with analog passive devices.

Generally, a compound semiconductor device for an MMIC uses a gate electrode of a refractory metal or a conductive compound such as silicide, and a pair of diffusion regions of $n^+$-type are formed in a compound semiconductor substrate, on which the compound semiconductor device is constructed, in a self-alignment process such that the $n^+$-type diffusion regions are formed at both lateral sides of the gate electrode. In such a self-alignment process, the $n^+$-type diffusion regions are formed by an ion implantation process while using the gate electrode as a self-alignment mask. An example of such a compound semiconductor device is a MESFET.

In such a self-aligned MESFET, it is possible to avoid the problem of degradation of the Schottky contact right underneath the gate electrode, which may be caused at the time of the thermal annealing process conducted typically at the temperature of about 800° C. for activating the impurity elements introduced by the foregoing ion implantation process, by using a refractory conductive compound such as WSi for the gate electrode.

In view of the fact that such refractive conductive compounds have a resistivity larger than the resistivity of Au or Al, which is used commonly for a gate electrode of an ordinary MESFET, the gate electrode of the MESFET for use in such high-speed or microwave applications is generally formed to have a dual-layer structure in which a low-resistance metal electrode of W or Au is provided on the gate electrode of the refractory conductive compound for maximizing the operational speed.

Further, such a MESFET for microwave applications includes an ohmic electrode having a structure of Au/Ni/AuGe on the $n^+$-type diffusion regions, wherein it should be noted that the AuGe component in the ohmic electrode forms an alloy at the interface to the GaAs substrate, and hence the desired ohmic contact.

In the case of analog circuits for ultra high-frequency applications, particularly an analog circuit for use in the final stage amplifier of a cellular phone, it is advantageous to integrate the compound semiconductor device on a compound semiconductor substrate together with other passive devices such as capacitors or inductances in the form of MMIC. By doing so, it becomes possible to eliminate the use of long interconnection wires and associated problems of parasitic capacitance and inductance. Thus, the construction of MMIC is thought advantageous for high-performance high-speed semiconductor devices.

FIGS. 1A–1E show a conventional process of forming an MMIC including a self-aligned MESFET therein.

Referring to FIG. 1A, a buried p-type layer 11A is formed in a semi-insulating GaAs substrate 11 in correspondence to the device region in which a self-aligned MESFET is to be formed, and a channel layer 11B of n-type is formed on the buried p-type layer with an impurity concentration level adjusted such that the MESFET to be formed has a desired threshold characteristic.

In the step of FIG. 1A, a gate electrode 12A of WSi is formed on the channel layer 11B and a low-resistance gate electrode 12B of W is formed on the gate electrode 12A. The WSi gate electrode 12A and the W gate electrode 12B form together a single gate electrode structure 12.

Next, in the step of FIG. 1B, an ion implantation process of an n-type impurity element is conducted while using the gate electrode structure 12 as a mask, and there are formed diffusion regions 11C and 11D of $n^+$-type in the p-type buried layer 11A at both lateral sides of the gate electrode structure 12 after conducting a thermal annealing process.

Next, in the step of FIG. 1C, ohmic electrodes 13A and 13B having the Au/Ni/AuGe structure are formed on the GaAs substrate 11 respectively in ohmic contact with the diffusion regions 11C and 11D, and a passivation film 14 and an interlayer insulation film 15 are deposited consecutively on the structure of FIG. 1C.

Next, in the step of FIG. 1D, a contact hole 15A is formed in the interlayer insulation film 15 so as to penetrate through the passivation layer 14 and expose the ohmic electrode 13B, and a interconnection pattern 16A is formed on the interlayer insulation film 15 in correspondence to the contact hole 15A and an interconnection pattern 16A is formed on the interlayer insulation film 15 in correspondence to the contact hole 15A in electric contact with the ohmic electrode 13B.

In the step of FIG. 1D, another interconnection pattern 16B is formed on the interlayer insulation film 15 simultaneously to the interconnection pattern 16A, and the interconnection patterns 16A and 16B are covered by a dielectric film 17 of SiN, and the like, in the step of FIG. 1E. Further, an interlayer insulation film 18 is deposited in the step of FIG. 1F on the structure of FIG. 1E. Further, an opening 18A is formed in the interlayer insulation film 18 in correspondence to the electrode pattern 16B, and an electrode pattern 19 is formed on the interlayer insulation film 17 in correspondence to the foregoing opening 18A. Thereby, the electrode pattern 19 forms, together with the electrode pattern 16B and the dielectric film 17, a monolithic capacitor integral with the self-aligned MESFET.

The MMIC of FIG. 1F, while having the advantageous feature of integrating active devices operable in the ultra high-frequency band with a cooperating passive element, has a drawback in that it requires two interlayer insulation films, the layers 15 and 18, and three interconnection pattern layers, the first interconnection pattern layer including the ohmic electrodes 13A and 13B, the second interconnection pattern layer including the interconnection patterns 16A and 16B, and the third interconnection layer including the electrode pattern 19, and the fabrication process becomes inevitably complicated.

Further, the MMIC of FIG. 1F further has a drawback in that the use of a T-shaped gate structure for the gate electrode structure 12 for reducing the gate length of the lower gate electrode 12A for further increase of the operational speed while simultaneously maintaining sufficient size for the upper low-resistance electrode 12B for avoiding unwanted increase of gate resistance, is difficult. When such a T-shaped gate structure is used in the self-alignment process for forming the diffusion regions 11C and 1D, the upper low-resistance gate electrode 12B acts as a mask and the diffusion regions 11C and 11D are formed with offset from the channel region right underneath the gate electrode 12A. When such an offset is caused, there occurs the problem of increase of the source resistance and hence the problem of decrease of conductance of the MESFET.

In the MMIC of FIG. 1F, it should be noted that the electrode pattern 16B forming the lower electrode of the capacitor is formed on the interlayer insulation film 15, due to the circumstances that the semi-insulating GaAs substrate 11 in fact has a weak n-type conductivity. Thus, in the case the lower electrode 16B is formed directly on the GaAs substrate 11, there is a possibility that a leakage current is caused to flow through the substrate 11 when a high voltage applied to the capacitor. Further, there is a risk, in the case the lower electrode 16B is formed directly on the GaAs substrate 11, in that the Au or Ge atoms in the lower electrode 16B, which includes an AuGe alloy, may cause a diffusion into the GaAs substrate 11 and form a leakage current path.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide an microwave monolithic integrated circuit including therein active devices and passive elements on a common substrate monolithically wherein the operational speed of the active devices is increased and the fabrication process is simplified.

Another object of the present invention is to provide a semiconductor device, comprising:

a compound semiconductor substrate;

a Schottky gate electrode formed on a first region of said compound semiconductor substrate with a first width;

a low-resistance gate electrode formed on said Schottky gate electrode with a second, larger width, said low-resistance gate electrode forming, together with said Schottky gate electrode, a T-shaped gate electrode structure;

a pair of ohmic electrodes making an ohmic contact with a surface of said compound semiconductor substrate in said first region at respective sides of said T-shaped gate electrode structure;

a lower electrode pattern formed on a second region of said compound semiconductor substrate in direct contact with said surface of said compound semiconductor substrate, said lower electrode pattern having a composition substantially identical with a composition of said low-resistance gate electrode;

a dielectric film formed on said lower electrode pattern: and an upper electrode pattern formed on said dielectric film.

According to the present invention, it becomes possible to form a diffusion region adjacent to the refractive Schottky electrode having a reduced width and forming a lower part of a T-shaped gate electrode in a self-aligned process. Further, it becomes possible to form a lower electrode of a capacitor concurrently to the low-resistance electrode forming an upper part of the T-shaped gate electrode. Thereby, it becomes possible to form the integral structure of the active device and the capacitor efficiently. Particularly, the present invention can effectively and successfully minimize the leakage current in spite of the construction of providing the capacitor lower electrode directly on the compound semiconductor substrate by forming the second region of the compound semiconductor substrate in the form of a high-resistance region containing a p-type impurity element, rather than using a deep impurity element as practiced in the conventional art. By forming the first region such that the first region contains the same p-type impurity element contained in the second region with substantially an identical concentration, it becomes possible to form the first and second regions simultaneously. In view of the fact that the present invention no longer uses deep impurity element as noted above, there arises no problem with regard to the operation of the semiconductor device even when a high-resistance region is formed in the first region. By forming a p-type well in the first region so as to include the channel region and such that the p-type region of the p-type well is located underneath the n-type channel layer, it becomes possible to suppress the short-channel effect of the semiconductor device efficiently.

It should be noted that, in the semiconductor device of the present invention summarized above, it is possible to form a compound having the composition of AsTi and acting as a diffusion barrier on the surface of the compound semiconductor substrate by forming the lower electrode contacting directly with the surface of the compound semiconductor substrate in the second region by a Ti layer in direct contact with the compound semiconductor substrate and a low resistance metal layer formed on such a Ti layer. As a result of formation of such a diffusion barrier, the problem of diffusion of Au or Ge contained in the AuGe alloy constituting the capacitor lower electrode into the compound semiconductor substrate is effectively eliminated. Further, the Ti layer improves adhesion of the capacitor lower electrode to the compound semiconductor substrate.

In a further aspect of the present invention summarized above, it becomes possible to form first and second diffusion regions of n-type in the compound semiconductor substrate in alignment with the Schottky gate electrode even in such a case the compound semiconductor device has a T-shaped gate electrode structure. Accordingly, the present invention can avoid the problem of increase of source resistance caused in conventional semiconductor devices having a T-shaped gate electrode when the diffusion regions are formed in a self-alignment process by using the T-shaped gate electrode as a self-alignment mask. Further, it becomes possible to simplify the fabrication process of the semiconductor device by forming the dielectric film as a part of a passivation film protecting the surface of the semiconductor device.

In a further aspect of the present invention summarized above, it becomes possible to form a desired interconnection pattern on the compound semiconductor substrate by a simple process, by extending the high-resistance region forming the second region in the compound semiconductor substrate along a desired interconnection pattern and forming the interconnection pattern on such an extending high-resistance region with a composition substantially identical with the composition of the lower electrode pattern of the capacitor.

Another object of the present invention is to provide a microwave integrated circuit, comprising:

a compound semiconductor substrate;

an active device formed in a first region of said compound semiconductor substrate;

a high-resistance part formed in a second, different region of said compound semiconductor substrate; and an interconnection pattern extending on the compound semiconductor substrate along said high-resistance part, said high-resistance part containing a p-type impurity element, said interconnection pattern comprising a Ti layer in contact with a surface of said compound semiconductor substrate directly and a low-resistance metal layer formed on said Ti layer.

According to the present invention, a desired interconnection pattern can be formed easily on a compound semiconductor substrate, by forming a high-resistance region containing a p-type element in the compound semiconductor substrate along the desired interconnection pattern. Thereby, the problem of increased leakage current, caused as a result of carrier trapping, is effectively eliminated by forming the high-resistance region by introducing a p-type impurity element rather than using a deep impurity element. Thus, the present invention is suitable for a microwave monolithic integrated circuit in which high-speed active devices are integrated with passive devices and interconnection patterns on a compound semiconductor substrate. In the present invention, too, the adherence of the low-resistance metal layer to the compound semiconductor substrate is improved due to the existence of the intervening Ti layer. Further, the problem of diffusion of the metal elements in the low-resistance metal layer into the substrate is eliminated.

Another object of the present invention is to provide a method of fabricating a microwave monolithic integrated circuit, comprising the steps of:

forming first and second high-resistance regions on a compound semiconductor substrate substantially simultaneously, by conducting an ion implantation process into a first and second regions of said compound semiconductor substrate;

forming an active device on said first region; and forming a capacitor on said second region.

According to the present invention, it is possible to suppress the short-channel effect by increasing the resistance of the first region on which the active device is formed, by conducting an ion implantation process of a p-type impurity element into the first region. As a result of suppressing of the short-channel effect, the present invention can successfully maximize the operational speed of the active device. Further, formation of the high-resistance region in the second region, on which the capacitor is to be formed, by the ion implantation process of the p-type impurity element is effective for minimizing the leakage current to the compound semiconductor substrate from the capacitor. Thereby, it becomes possible to form the first and second high-resistance regions substantially simultaneously by using the same impurity element in the first and second high-resistance regions. As the present invention uses no deep impurity element for the first and second high-resistance regions, there occurs no adversary effect on the operation of the active device.

By implementing the process of forming the active device and the capacitor in the present invention summarized above according to the steps of: forming a Schottky gate electrode of a refractory metal compound on the first region; introducing an impurity element of an n-type into the first region of the compound semiconductor substrate while using the Schottky gate electrode as a mask; covering the surface of the compound semiconductor substrate by a first resist mask such that the first resist mask exposes the Schottky gate electrode in the first region and such that the first resist mask includes a first opening exposing the surface of the compound semiconductor substrate in the second region; covering the first resist mask with a second resist mask having a second opening exposing the Schottky gate electrode and a third opening exposing the first opening; depositing a low-resistance metal layer on the second resist mask such that the low-resistance metal layer covers the Schottky gate electrode at the second opening and such that the low-resistance metal layer covers the surface of the compound semiconductor substrate exposed at the third opening; lifting off the low-resistance metal layer deposited on the second resist mask such that the low-resistance metal layer remains on the Schottky electrode as a low-resistance gate electrode and such that the low-resistance metal layer remains on the second region as the lower electrode of the capacitor, it becomes possible to form the diffusion regions adjacent to the Schottky gate electrode by a self-alignment process even in such a case the active layer has the T-shaped gate electrode structure. Associated with this, it becomes possible to reduce the source resistance of the active device. As the upper, low-resistance electrode of the T-shaped gate electrode structure and the lower electrode of the capacitor on the compound semiconductor substrate are formed simultaneously according to the foregoing process, the efficiency of production of the microwave monolithic integrated circuit is improved.

By conducting the step of depositing the low-resistance metal layer by the steps of depositing a Ti layer and depositing the low-resistance metal layer on the Ti layer, it becomes possible to form a compound having a composition AsTi at the interface between the capacitor lower electrode and the compound semiconductor substrate, wherein the compound AsTi thus formed functions as a diffusion barrier and the diffusion of Au or Ge from the AuGe alloy contained in the capacitor lower electrode into the compound semiconductor substrate is effectively blocked.

By using a resist having a large sensitivity at the bottom part and smaller sensitivity at the top part for the second resist mask, it is possible to form the low-resistance gate electrode pattern to have a trapezoidal shape suitable for a lift-off process, such that the low-resistance gate electrode has a large base and a small top, both for the T-shaped gate electrode structure and the capacitor lower electrode.

Other objects and further features of the present invention will become apparent from the following detailed description when read in conjunction with the attached drawings.

DETAILED DESCRIPTION OF THE INVENTION

[First Embodiment]

FIGS. 2A–2I show the fabrication process of an MMIC 20 according to a first embodiment of the present invention.

Figure 1A:
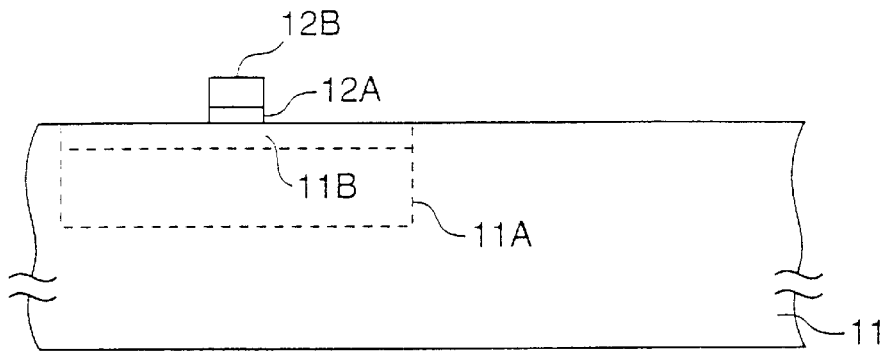
FIGS. 1A–1F are diagrams showing the fabrication process of an MMIC according to a related art.
Figure 1B:
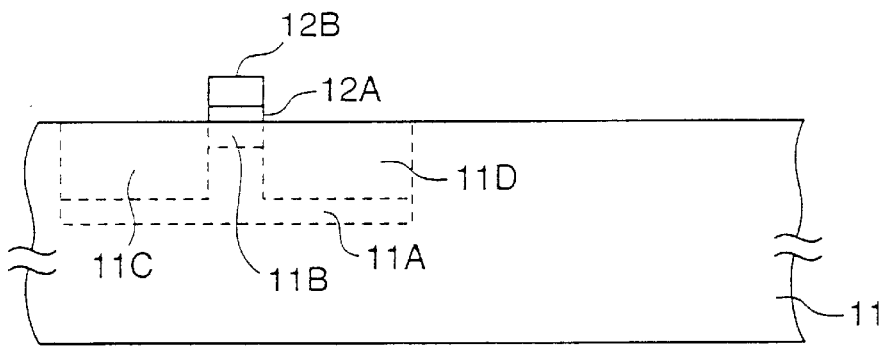
Figure 1C:
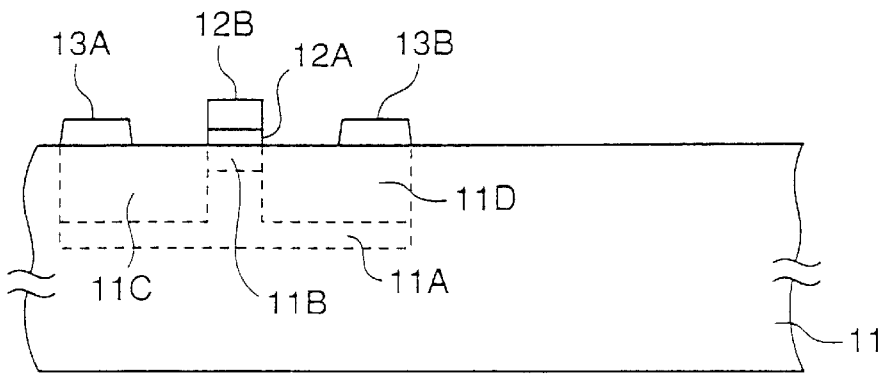
Figure 1D:
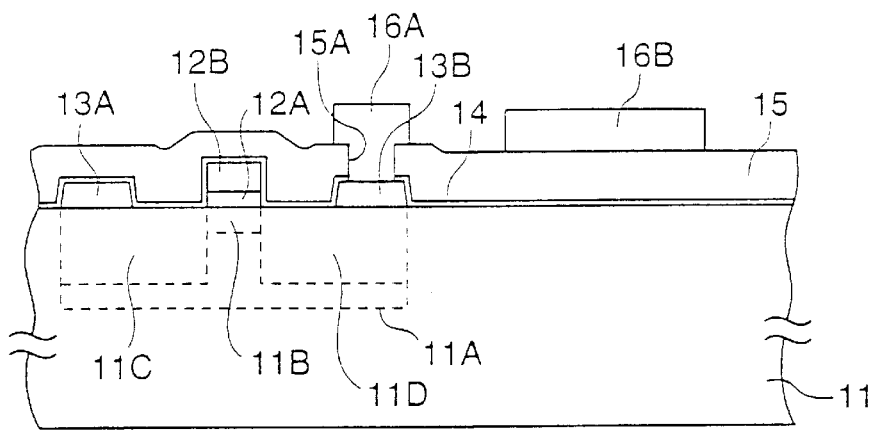
Figure 1E:
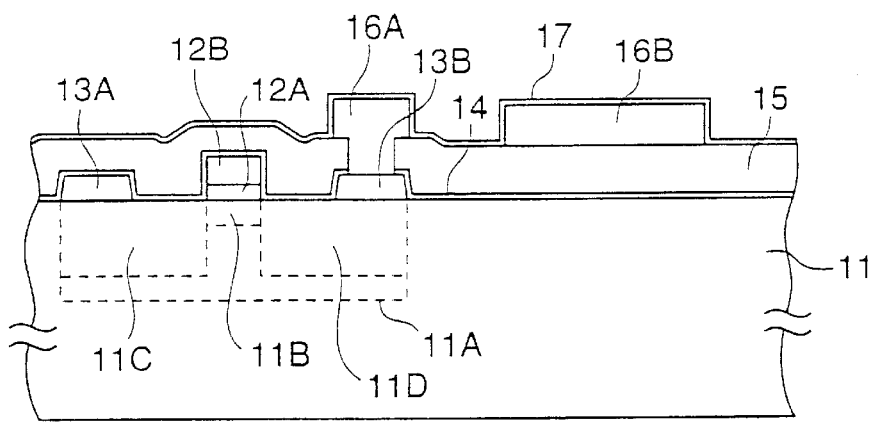
Figure 1F:
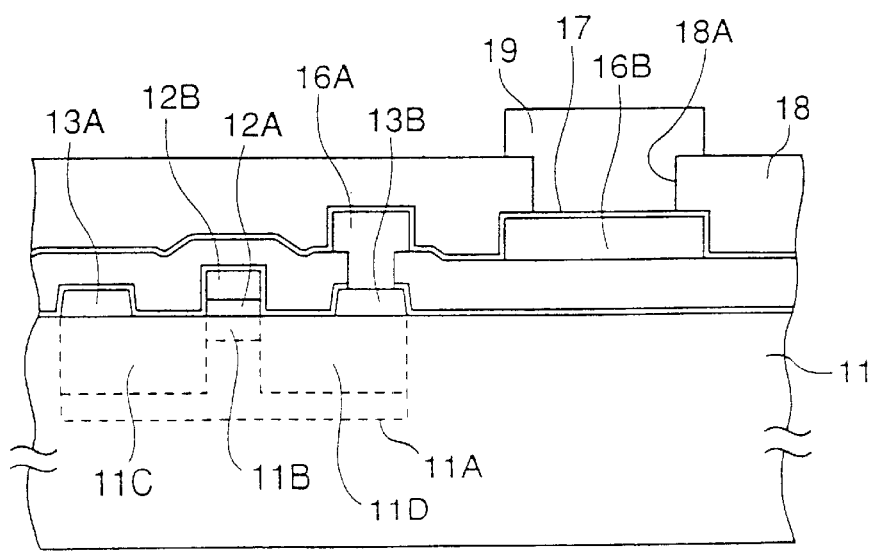
Figure 2A:
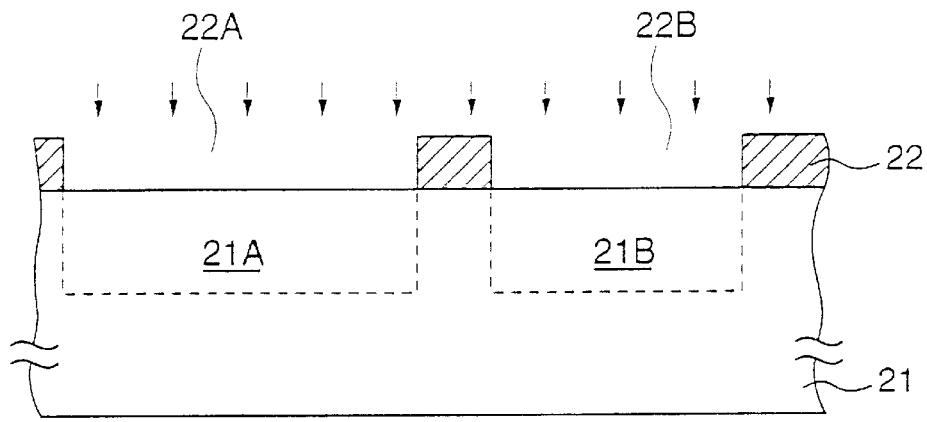
FIGS. 2A–2I are diagrams showing the fabrication process of an MMIC according to a first embodiment of the present invention.

Referring to FIG. 2A, a semi-insulating GaAs substrate 21 is covered with a resist pattern having an opening 22A corresponding to an active device region and an opening 22B corresponding to a capacitor region of the MMIC 20 to be formed, and an ion implantation process of a p-type impurity element, typically Mg, is conducted into the substrate 21 while using the resist pattern 22 as a mask. As a result of the ion implantation process, there is formed a high-resistance region 21A in the active device region in correspondence to the opening 22A and another high-resistance region 21B is formed in the capacitor region in correspondence to the opening 22B. In view of the fact that a semi-insulating GaAs substrate has a weak n-type conductivity, the foregoing ion implantation process of the p-type impurity element is conducted with a dose adjusted such that the n-type conductivity in the substrate is substantially cancelled out. In the case Mg is used for the p-type impurity element, the ion implantation process in the step of FIG. 2A may be conducted under an acceleration voltage of 250 keV with a dose of about $1.0 \times 10^{12}$ cm$^{-2}$.

It should be noted that the high-resistance region 21A isolates the active device region and simultaneously suppresses the short-channel effect in the high-speed active device formed on the active device region. Due to the fact that the high resistance region 21A is formed by the ion implantation process of the p-type impurity element, it should be noted that there occurs no adversary effect on the operation of the active device contrary to the case of introducing a deep impurity element into the substrate 21 for forming the active device region. Typically, the high-resistance regions 21A and 21B have a depth of several tens to one hundred nanometers.

Figure 2B:
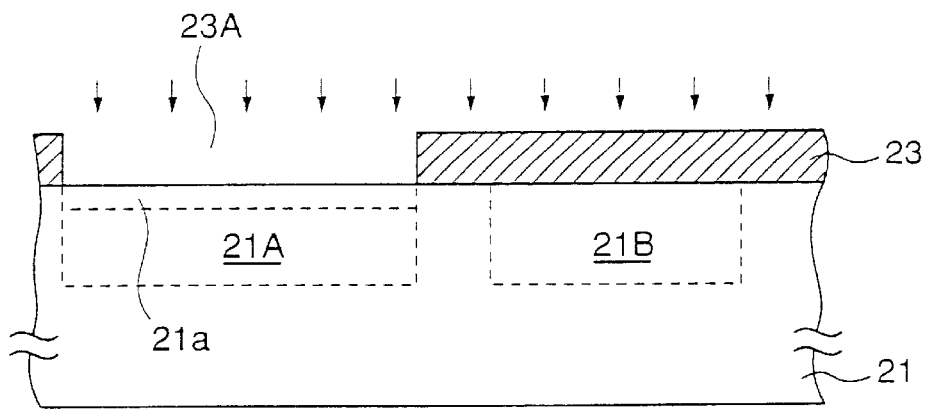

Next, in the step of FIG. 2B, the resist pattern 22 is removed and a next resist pattern 23 having an opening 23A exposing the high-resistance region 21A is formed on the substrate 21. Further, an ion implantation process of an n-type impurity element such as Si is conducted into the substrate 21 while using the resist pattern 23 as a mask, to form an n-type layer 21a acting as an active layer of a MESFET on the surface of the high-resistance region 21A. In the case Si is used for the n-type impurity element, the ion implantation process may be conducted under the acceleration voltage of 40 keV with a dose of about $4.0 \times 10^{12}$ cm$^{-2}$.

Figure 2C:
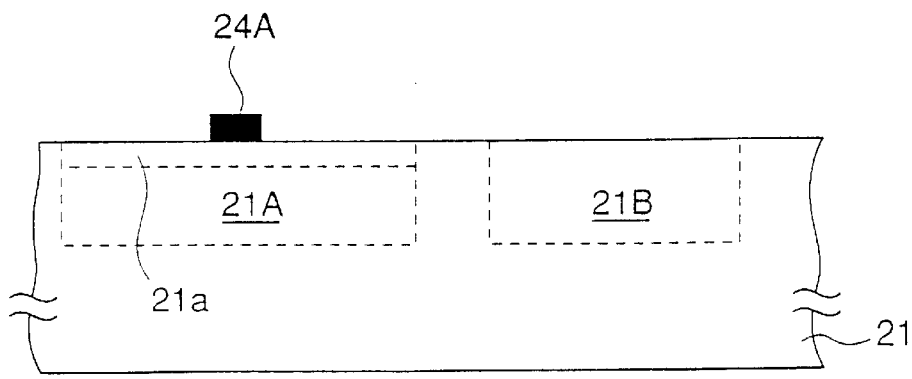

Next, in the step of FIG. 2C, the resist pattern 23 is removed and a WSi gate electrode pattern 24A is formed on the n-type active layer 21a with a thickness of about 0.4 μm by a sputtering process of a WSi layer, followed by a patterning process thereof.

Figure 2D:
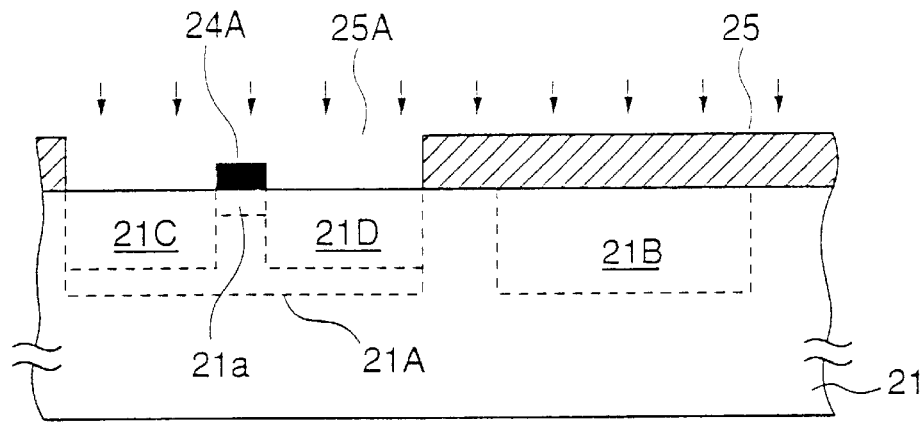

Next, in the step of FIG. 2D, there is formed a resist pattern 25 having an opening 25A corresponding to the active device region, in which the WSi gate electrode pattern 24A is included, and an ion implantation process of Si is conducted into the GaAs substrate 21 while using the resist pattern 25 and the WSi gate electrode 24A as a mask, to form diffusion regions 21C and 21D of n⁺-type at both lateral sides of the WSi gate electrode 24A. The ion implantation process may be conducted under an acceleration voltage of about 90 keV with a dose of about $5.0 \times 10^{13}$ cm$^{-2}$.

Figure 2E:
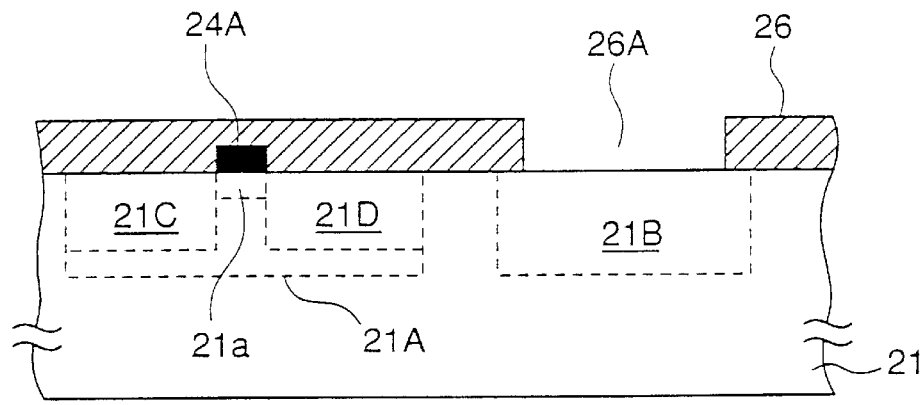

Next, in the step of FIG. 2E, the resist pattern 25 is removed and an activating anneal process is applied at a temperature of about 800° C. Further, another resist pattern 26 having an opening 26A corresponding to the high-resistance region 21B of the capacitor region is provided on the GaAs substrate 21 with a thickness of about 0.8 μm so as to cover the WSi gate electrode 24A. The resist pattern 26 thus formed is subjected to a heat treatment process typically conducted at 140° C. for 5 minutes so as to eliminate photosensitivity therefrom. The resist pattern 26 thus processed is subjected to a dry etching process for reducing the thickness thereof, wherein the dry etching process is continued until a top surface of the WSi gate electrode 24A is exposed.

Figure 2F:
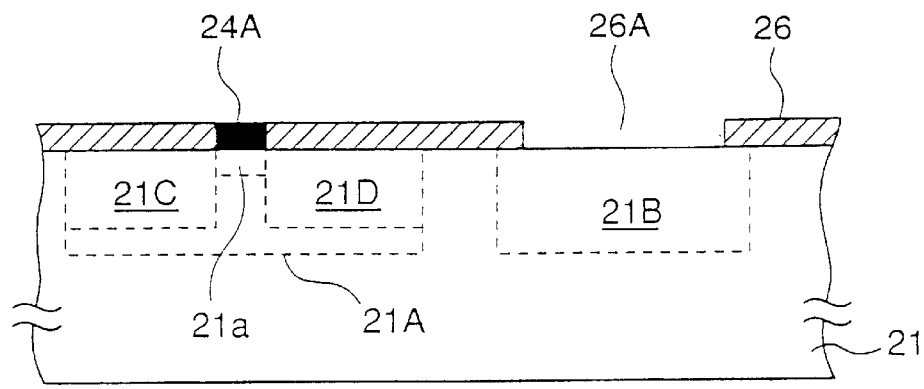
Figure 2G:
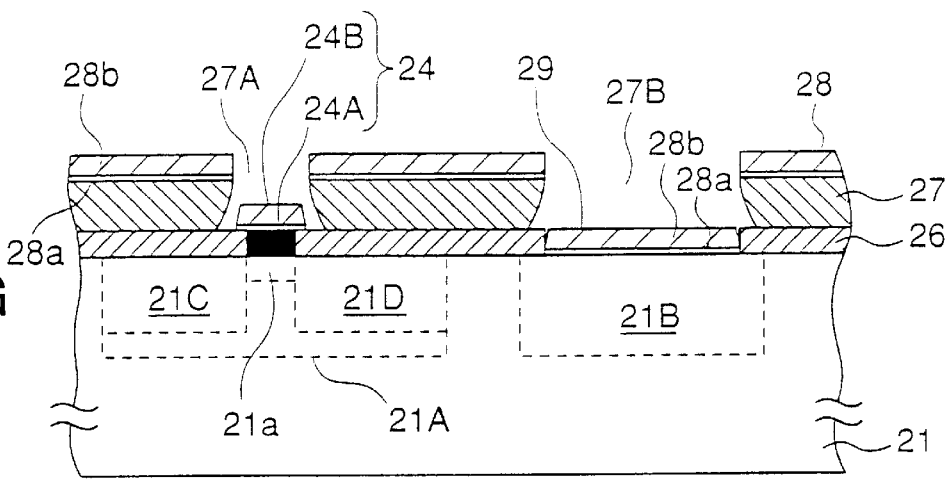

Next, in the step of FIG. 2G, a dual-layer resist pattern 27 is formed on the structure of FIG. 2F such that the dual layer resist pattern 27 has a large photosensitivity at the bottom part thereof and a reduced photosensitivity at the top part thereof. The resist pattern 27 is formed with an opening 27A exposing the WSi gate electrode 24A and opening 27B exposing the resist opening 26A, and a Ti layer 28a having a thickness of about 5 nm and an Au layer 28b having a thickness of about 0.4 μm are deposited consecutively on the resist pattern 27. As a result, there is formed a low-resistance gate electrode 24B on the WSi gate electrode 24A in the opening 27A such that the low-resistance gate electrode 24B has a lateral size larger than a lateral size of the gate electrode 24A. The low-resistance gate electrode 24B is thus formed of a stacking of the Ti layer 28a and the Au layer 28b and constitutes a T-shape gate electrode 24 of the active device together with the gate electrode 24A. Further, there is formed an electrode pattern 29 of a stacking of the Ti layer 28a and the Au layer 28b on the high resistance region 21B in correspondence to the opening 27B. In the description hereinafter, the designation of the Ti layer 28a and the Au layer 28b is omitted for simplicity and a simple designation of "low-resistance layer 28" will be used for the foregoing layers 28a an 28b.

Figure 2H:
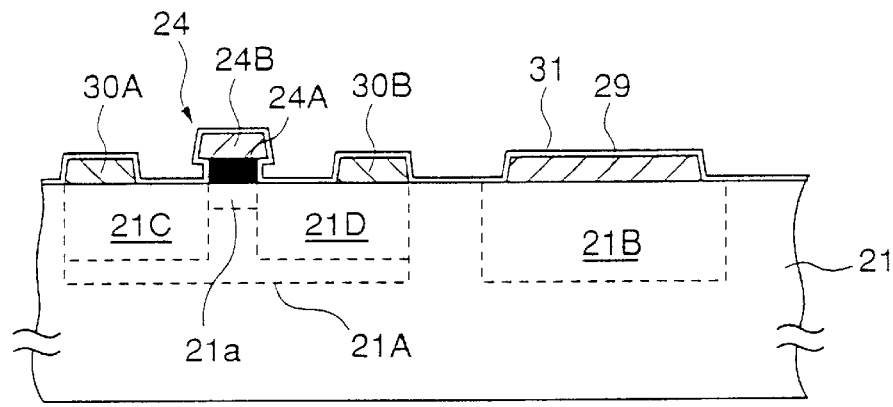

Next, in the step of FIG. 2H, the low-resistance layer 28 is lifted off together with the resist patterns 26 and 27, and ohmic electrodes 30A and 30B, each having an Au/Ni/AuGe stacked structure, are formed on the structure thus obtained such that the ohmic electrode 30A makes an ohmic contact with the n+-type diffusion region 21C and the ohmic electrode 30B makes an ohmic contact with the n+-type diffusion region 21D. Further, a passivation film 31 of SiN is deposited on the compound semiconductor substrate 21 so as to cover the ohmic electrodes 30A and 30B and further the T-shaped gate electrode 24 and the electrode pattern 29 with a thickness of 0.2 μm. Further, in the step of FIG. 2I, an interlayer insulation film 32 is provided on the structure of FIG. 2H and contact holes 32A and 32B are formed in the interlayer insulation film 32 so as to expose the ohmic electrode 30B and so as to expose the SiN film covering the electrode pattern 29, respectively. It should be noted that the contact hole 32A is formed so as to penetrate through the SiN film 31 on the ohmic electrode 30B.

Figure 2I:
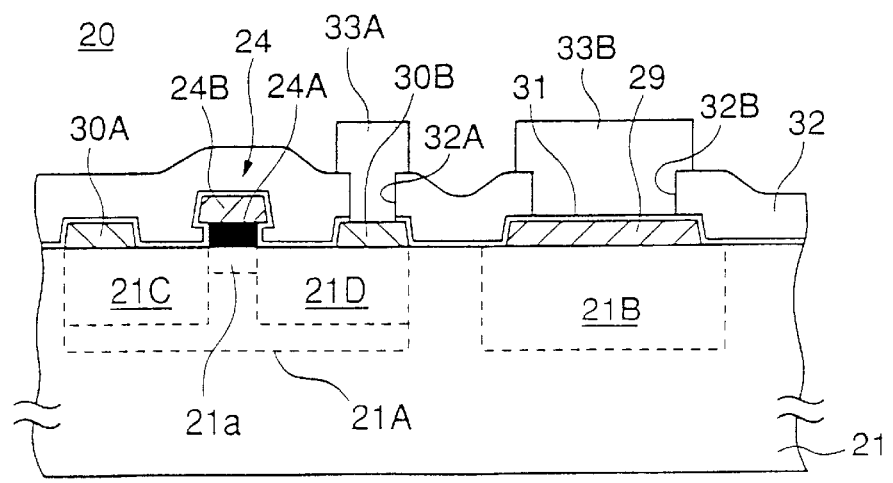

By forming an electrode pattern 33A on the interlayer insulation film 32 so as to make a contact with the ohmic electrode 30B at the contact hole 32A and by forming an electrode pattern 33B so as to cover the SiN film 32 at the contact hole 32B, the desired MMIC 20 is completed as represented in FIG. 2I. It should be noted that the MMIC 20 of FIG. 2I includes a self-aligned MESFET having the T-shaped gate electrode 24 in the high-resistance region 21A and further a capacitor having the SiN film 31 sandwiched by the electrode patterns 29 and 33B in the high-resistance region 21B.

In the present embodiment, the MESFET uses the n-type layer 21a formed in the high-resistance region 21A for the channel layer thereof, and thus, it becomes possible to suppress the short-channel effect effectively even in such a case the gate length is reduced to about 0.8 μm. Thus, it becomes possible to construct a very fast MESFET having a cut-off frequency of as much as 26 GHz. Further, the present embodiment enables formation of a capacitor on the common compound semiconductor substrate 21 by forming the high-resistance region 21B on the substrate 21 at a region different from the region for the active device. As the capacitor is formed on the high-resistance region 21B, leakage current is suppressed successfully even in the case the lower electrode 29 of the capacitor is formed directly on the substrate 21.

Thus, the present embodiment simplifies the fabrication process of the capacitor and the cost for producing the MMIC is reduced. In the present embodiment, it is possible to use a low resistance layer such as Pt or Al in place of the Au layer 28b. Further, it is possible to use a TiW layer in place of the Ti layer 28a.

While not illustrated, it is also possible in the present embodiment to form the high-resistance region 21B so as to extend over the surface of the substrate and extend the electrode pattern 29 on the high-resistance region 21B as an interconnection pattern. Further, it is possible to form an inductor on the compound semiconductor substrate 21 by forming the high-resistance region 21B and the interconnection pattern 29.

[Second Embodiment]

Figure 3:
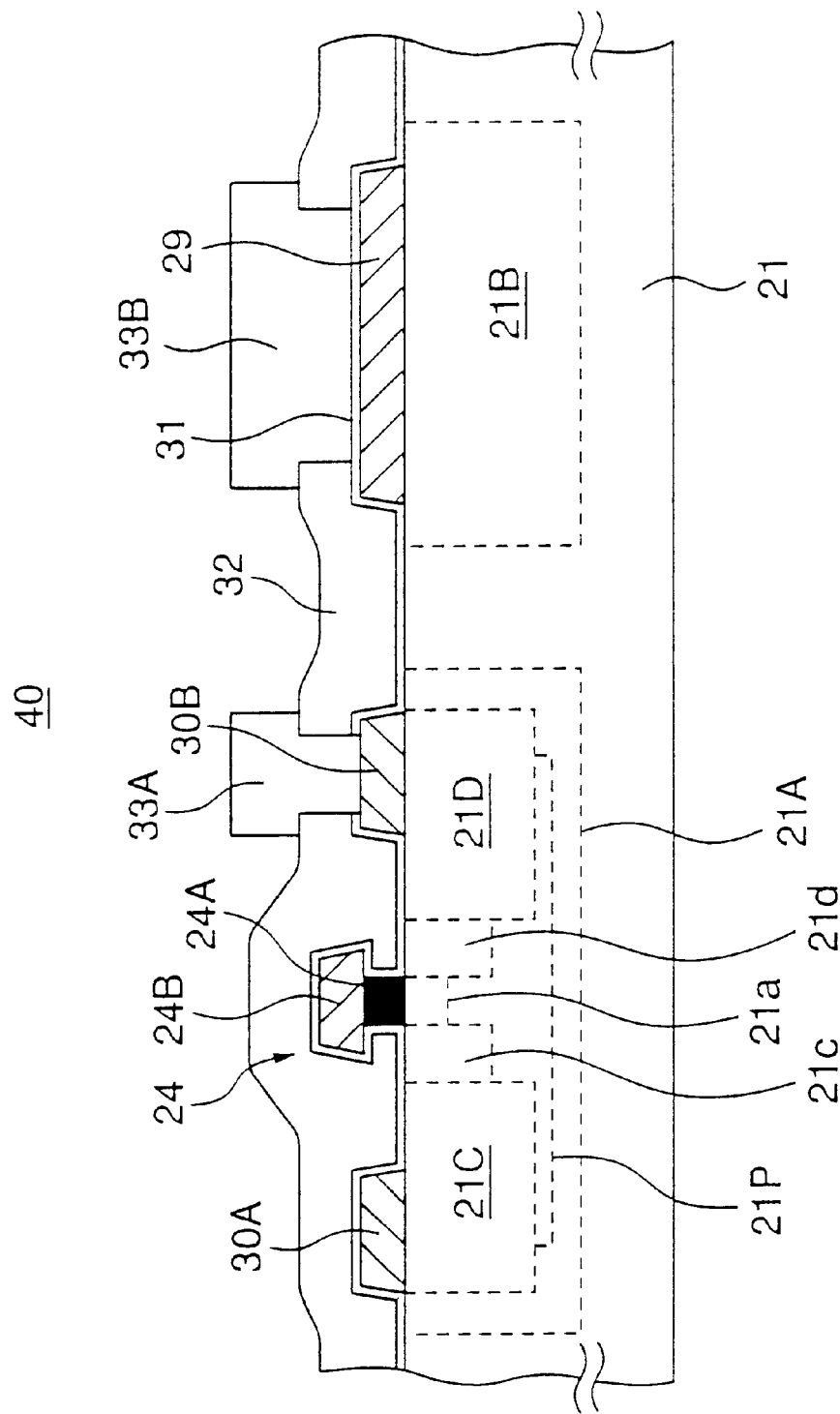
FIG. 3 is a diagram showing the construction of an MMIC according to a second embodiment of the present invention.

FIG. 3 shows the construction of an MMIC 40 according to a second embodiment of the present invention, wherein those parts corresponding to the parts described previously are designated by the same reference numerals and the description thereof will be omitted.

Referring to FIG. 3, there is formed a p-type well 21P inside the high-resistance region 21A so as to include the channel layer 21a and further the n$^+$-type diffusion regions 21C and 21D at least partially. Such a p-type well 21P can be formed by an ion implantation process of Mg conducted under the acceleration voltage of 120 keV with a dose of $3.0 \times 10^{12}$ cm$^{-2}$. The p-type well 21P constitutes a p-type region underneath the n-type layer 21a forming the channel layer of the MESFET.

In the present embodiment, the channel layer 21a is formed by an ion implantation process of Si conducted under an acceleration voltage of 20 keV with a dose of $9.0 \times 10^{12}$ cm$^{-2}$ and is thus formed at a slightly shallow level as compared with the previous embodiment. The high-resistance regions 21A and 21B and the n$^+$-type diffusion regions 21C and 21D are formed similarly as before.

Further, in the present embodiment, there are formed an LDD (lightly doped drain) region 21c of n$^-$-type between the channel layer 21a right underneath the WSi gate electrode 24A and the n$^+$-type diffusion region 21C and another LDD region 21d of n$^-$-type between the channel layer 21a and the n$^+$-type diffusion region 21D, as a result of an ion implantation process conducted under the acceleration voltage of 50 keV with a dose of $5.0 \times 10^{13}$ cm$^{-2}$. It should be noted that such LDD regions 21c and 21d can be formed in a step corresponding to the step of FIG. 2D. In this case, the n$^+$-type diffusion regions 21C and 21D may be formed in the step of FIG. 2D, after forming the LDD regions 21c and 21d, by forming sidewall insulation films on the WSi gate electrode 24A and using the sidewall insulation films and the WSi gate electrode 24A as a self-aligned mask.

In the construction of the MMIC 40 of FIG. 3, the existence of the p-type region 21P underneath the channel layer 21a effectively eliminates the short-channel effect and the MESFET operates properly even in the case the gate length Lg is reduced to 0.4 μm. In this case, the cut-off frequency of the MESFET reaches as much as 45 GHz.

[Third Embodiment]

FIGS. 4A–4E show the fabrication process of an MMIC according to a third embodiment of the present invention, wherein those parts corresponding to the parts described previously are designated by the same reference numerals and the description thereof will be omitted.

Figure 4A:
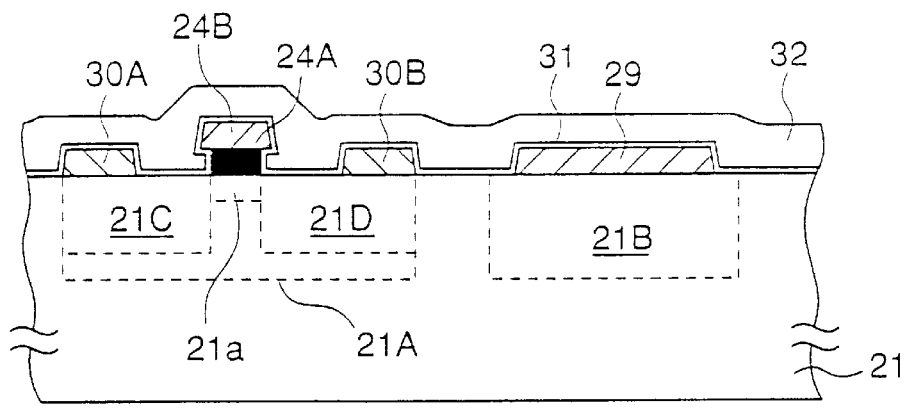
FIGS. 4A–4E are diagrams showing the construction of an MMIC according to a third embodiment of the present invention.

Referring to FIG. 4A, the process starts with the structure of FIG. 2H and the interlayer insulation film 32 is provided on the structure of FIG. 2H. Next, in the step of FIG. 4B, the contact holes 32A and 32B are formed as explained previously while using a resist pattern 34.

Figure 4B:
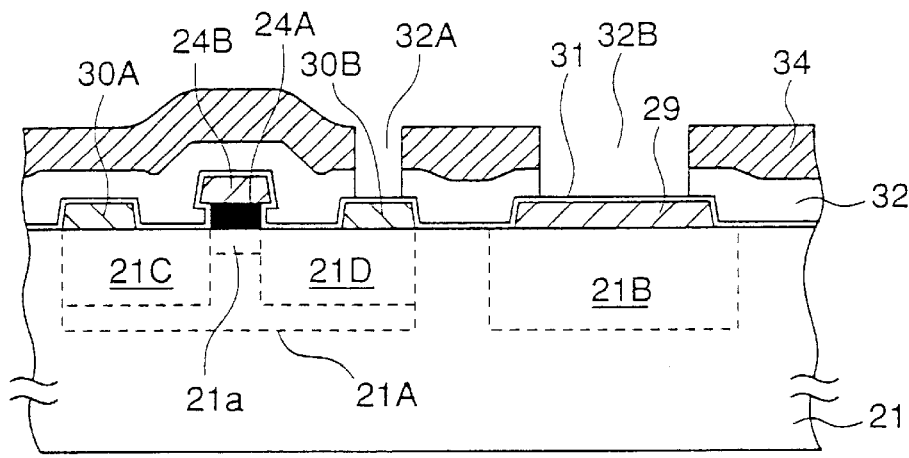
Figure 4C:
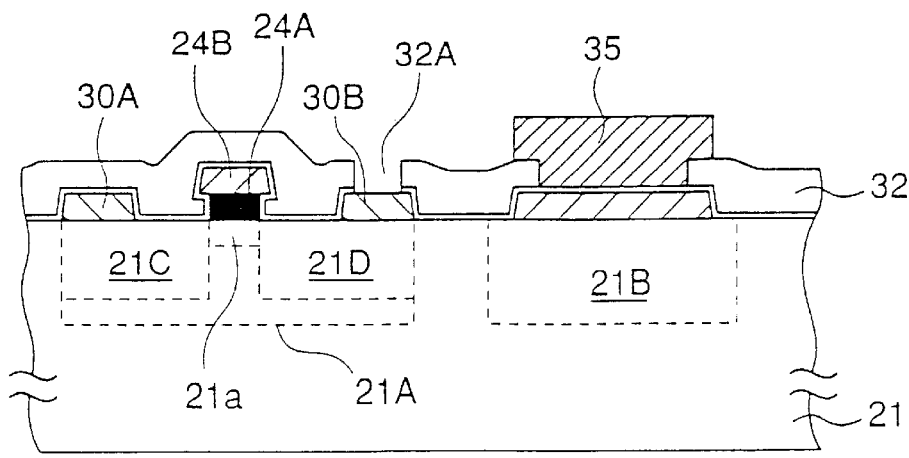

Next, in the step of FIG. 4C, the resist pattern 34 is removed and another resist pattern 35 is formed on the interlayer insulation film 32 so as to cover the opening 32B, and a dry etching process is applied in the step of FIG. 4C while using the resist pattern 35 as a mask. As a result, the SiN film 31 is removed in the contact hole 32A.

Figure 4D:
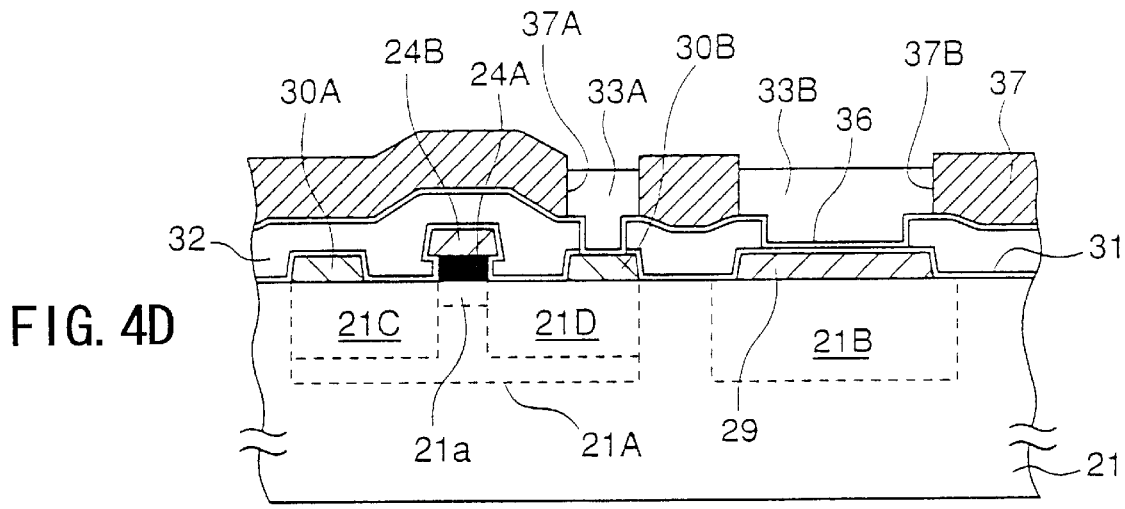

Next, in the step of FIG. 4D, the resist pattern 35 is removed and an Au layer 36 is deposited on the interlayer insulation film 32 uniformly with a thickness of typically about 0.1 μm. Further, a resist pattern 37 having openings 37A and 37B corresponding to the resist pattern 34 is formed on the Au layer 36, and an electrolytic plating process is conducted while using the resist pattern 37 as a mask and using the Au layer 36 as a seed layer. As a result of the electrolytic plating process, the electrode pattern 33 is formed in the resist opening 37A in the form of an electrolytic plating layer. Simultaneously, the electrode pattern 33B is formed in the opening 37B also in the form of an electrolytic plating layer.

Figure 4E:
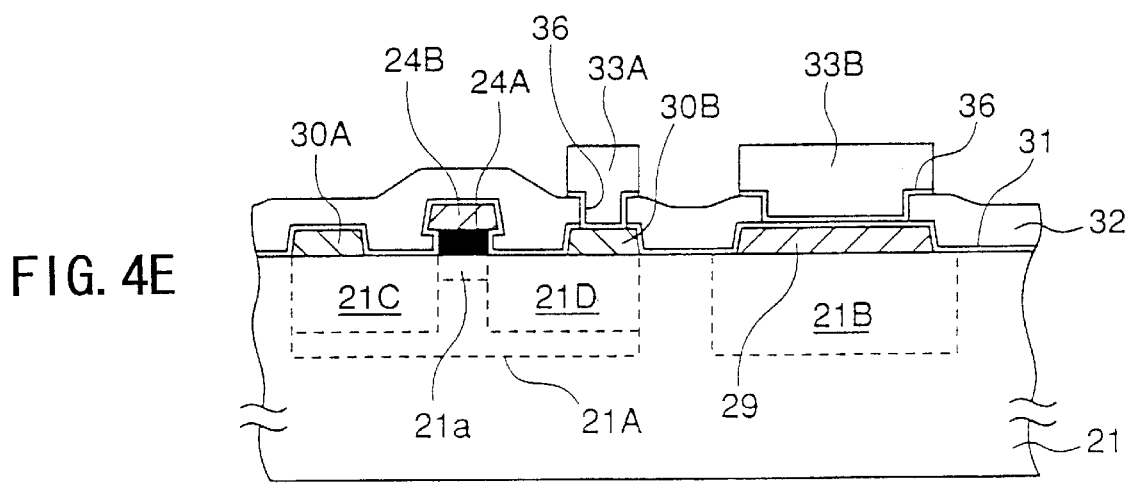

After the step of FIG. 4D, the resist pattern 37 is removed and the Au layer 36 is patterned by a dry etching process while using the electrode patterns 33A and 33B as a mask. As a result, there is formed a structure similar to the one shown in FIG. 2I as represented in FIG. 4E, wherein the structure of FIG. 4E is different from the structure of FIG. 2I in the point that the Au layer 36 is interposed between the electrode pattern 33B and the electrode pattern 29.

According to the process of the present embodiment, a capacitor having a capacitance of 0.4 fF/μm$^2$ is obtained by a single layer metal process.

[Fourth Embodiment]

FIGS. 5A–5E show the fabrication process of an MMIC according to a fourth embodiment of the present invention, wherein those parts corresponding to the parts described previously are designated by the same reference numerals and the description thereof will be omitted.

Figure 5A:
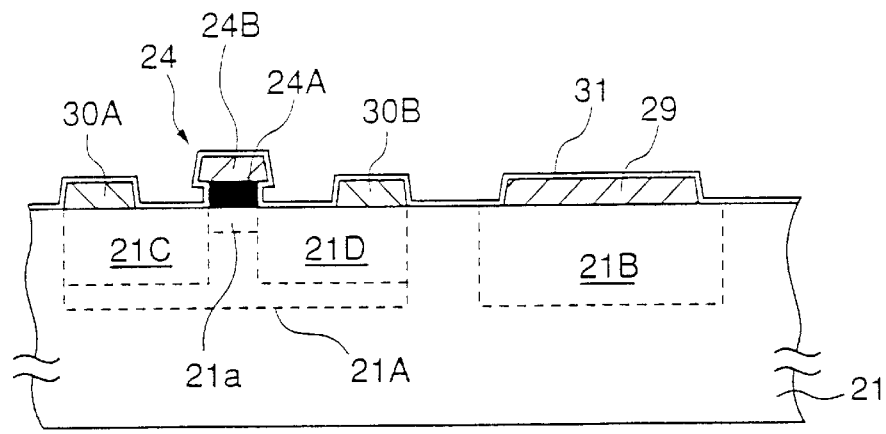
FIGS. 5A–5E are diagrams showing the construction of an MMIC according to a fourth embodiment of the present invention.

Referring to FIG. 5A, the process starts with a step corresponding to the structure of FIG. 2H and there is formed a structure in which the T-shaped gate electrode 24, the ohmic electrodes 30A and 30B and the capacitor electrode 29 are covered by the SiN passivation film on the GaAs substrate 21.

Figure 5B:
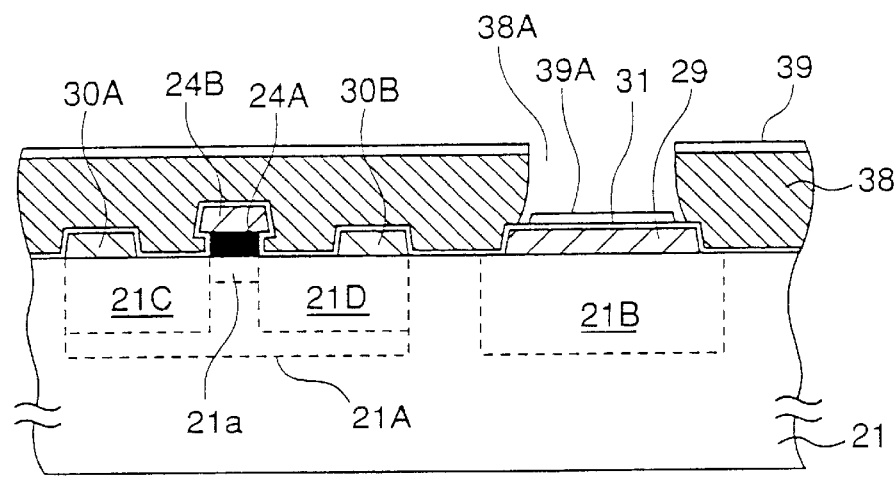

Next, in the step of FIG. 5B, a dual-layer resist film 38 having a high photosensitivity at a bottom part thereof and lower photosensitivity at a top part thereof is provided on the structure of FIG. 5A and a trapezoidal opening 38A suitable for a liftoff process is formed in the resist film 38 in correspondence to the capacitor electrode 29. Further, an Au layer 39 is deposited on the resist film 38 by a vacuum evaporation deposition process with a thickness of typically about 0.2 μm. As a result, there is formed an Au pattern 39A on the SiN film 31 in correspondence to the resist opening 38A as a part of the Au layer 39.

Figure 5C:
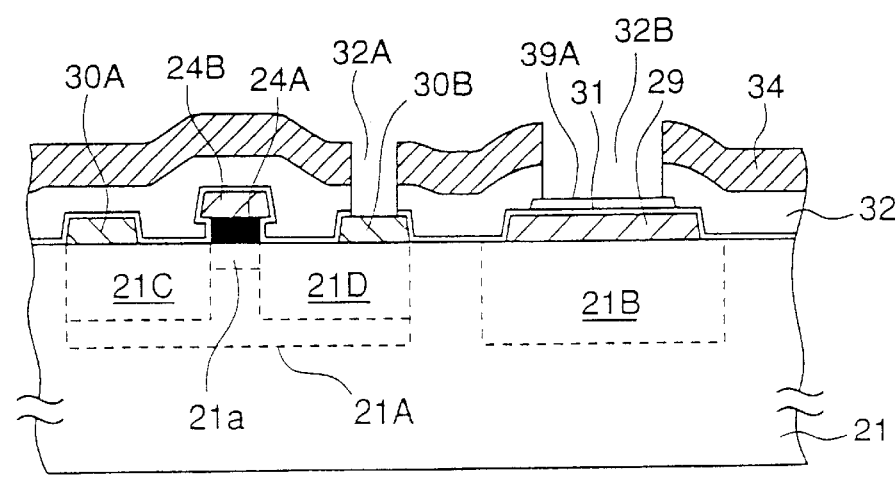

Next, in the step of FIG. 5C, the interlayer insulation film 32 and the resist pattern 34 are formed similarly to the step of FIGS. 4B and 4C, and the contact hole 32A and the contact hole 32B are formed in the interlayer insulation film 32 while using the resist pattern 34 as a mask, such that the contact hole 32A exposes the ohmic electrode pattern 30B and such that the contact hole 32B exposes the Au pattern 39A.

Figure 5D:
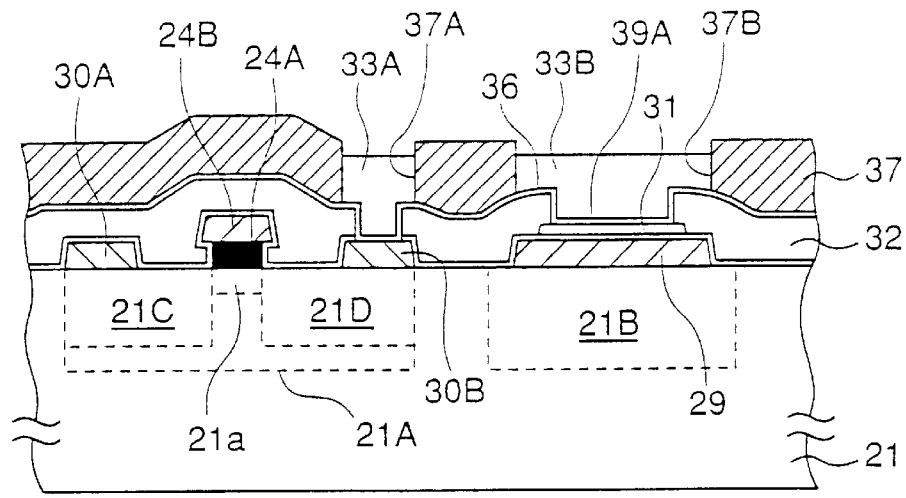

Next, in the step of FIG. 5D, the resist and the Au layer 36 is formed. Further, the resist pattern 37 is formed on the Au layer 36 thus formed. The resist pattern 37 is formed with the resist openings 37A and 37B respectively in correspondence to the ohmic electrode 30B and the capacitor electrode 29, and the electrode patterns 33A and 33B are formed respectively in the openings 37A and 37B by conducting an electrolytic plating process of Au while using the Au layer 36 as a seed layer.

Figure 5E:
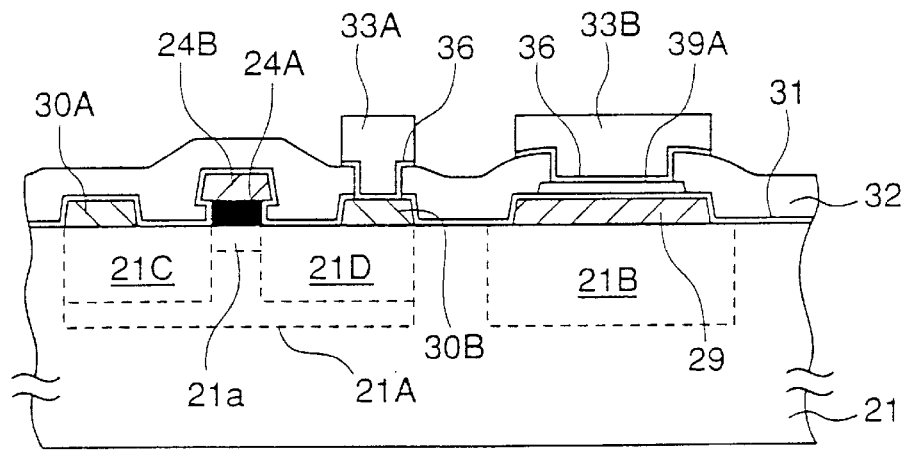

After the step of FIG. 5D, the resist pattern 37 is removed in the step of FIG. 5E and the Au layer 36 is removed except for the part locating underneath the electrode pattern 33A or 33B. As a result of the patterning of the Au layer 36, the MMIC represented in FIG. 5E is obtained.

In the present embodiment, it should be noted that the SiN film 31 on the capacitor lower electrode pattern 29 is protected by the Au pattern 39A. As a result, it becomes possible to avoid the problem of damaging or thinning of the SiN film 31 constituting the capacitor dielectric film at the time of forming the contact hole 32B in the interlayer insulation film 32 in the step of FIG. 5C. Thus, it becomes possible to form the MMIC with the designed capacitance value for the monolithic capacitor therein.

[Fifth Embodiment]

FIGS. 6A–6F show the fabrication process of an MMIC according to a fifth embodiment of the present invention, wherein those parts corresponding to the parts described previously are designated by the same reference numerals and the description thereof will be omitted.

Figure 6A:
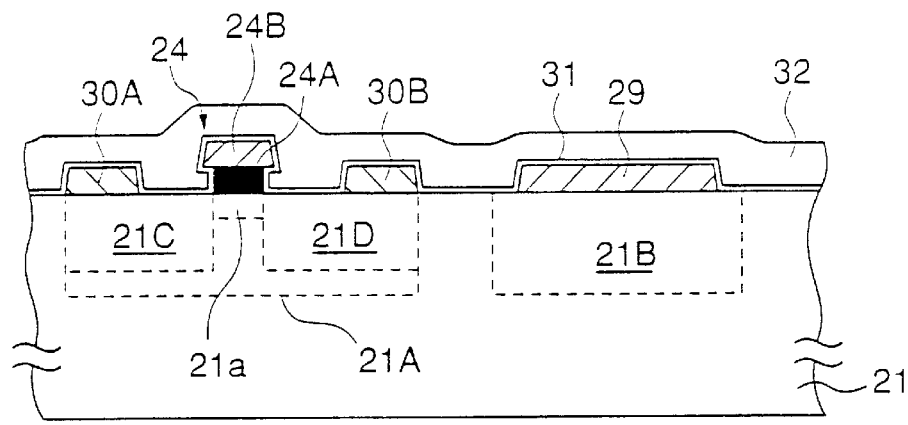
FIGS. 6A–6F are diagrams showing the construction of an MMIC according to a fifth embodiment of the present invention.

Referring to FIG. 6A, the process starts with the step corresponding to the step of FIG. 2H similarly to the process of FIG. 5A in that there is formed a structure including the T-shaped gate electrode structure 24, the ohmic electrodes 30A and 30B and the capacitor electrode 29 formed on the semi-insulating GaAs substrate 21, and the structure thus formed is covered successively by the SiN passivation film 31 and the interlayer insulation film 32.

Figure 6B:
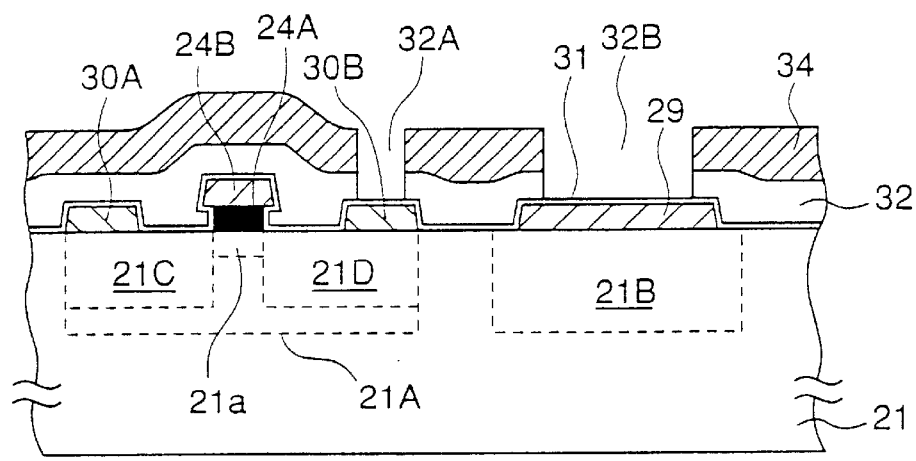
Figure 6C:
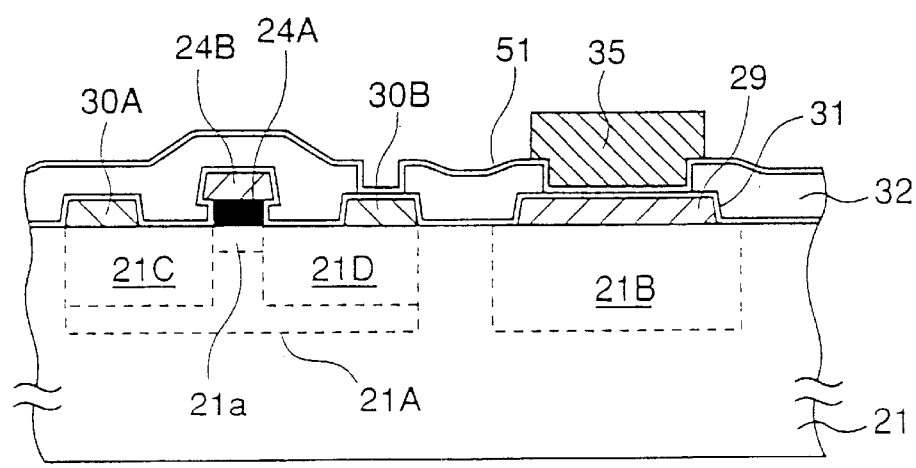

Next, in the step of FIG. 6B, the interlayer insulation film 32 is formed with the contact holes 32A and 32B by a resist process that uses the resist pattern 34 as a mask, and the resist pattern 34 is removed in the step of FIG. 6C. Further, an SiN film 51 is deposited uniformly on the interlayer insulation film 32, and the resist pattern 35 is formed so as to cover the opening 32B as represented in the step of FIG. 6C.

Figure 6D:
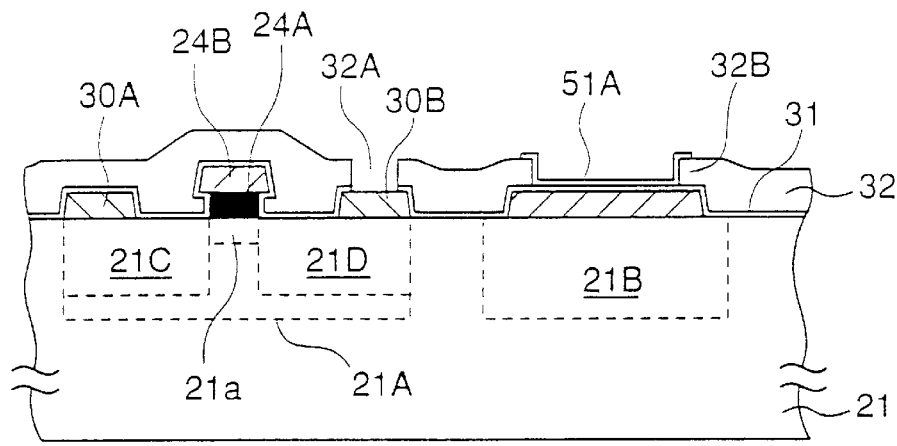

By patterning the SiN film 51 while using the resist pattern 35 as a mask, a structure represented in FIG. 6D is obtained such that there is left an SiN pattern 51A in the region including the contact hole 32B.

Figure 6E:
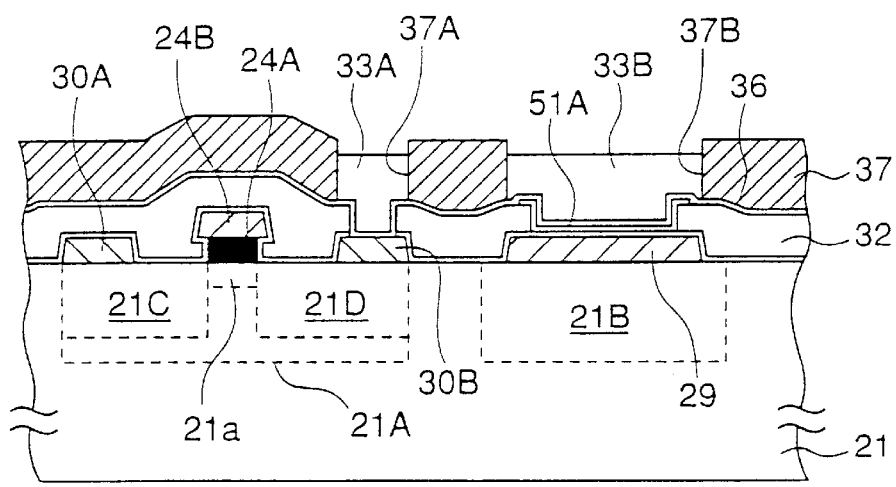

Next, in the step of FIG. 6E, the Au layer 36 is deposited on the interlayer insulation film 32 so as to cover the SiN pattern 51A, and the resist pattern 37 is formed further on the Au layer 36. Similarly to the previous embodiment, the resist pattern 37 includes therein the resist openings 37A and 37B respectively in correspondence to the electrode patterns 30B and 29, and an electrolytic plating process is conducted while using the Au pattern 36 as a seed layer. As a result of the electrolytic plating process, the electrode patterns 33A and 33B are formed respectively in correspondence to the openings 37A and 37B.

Figure 6F:
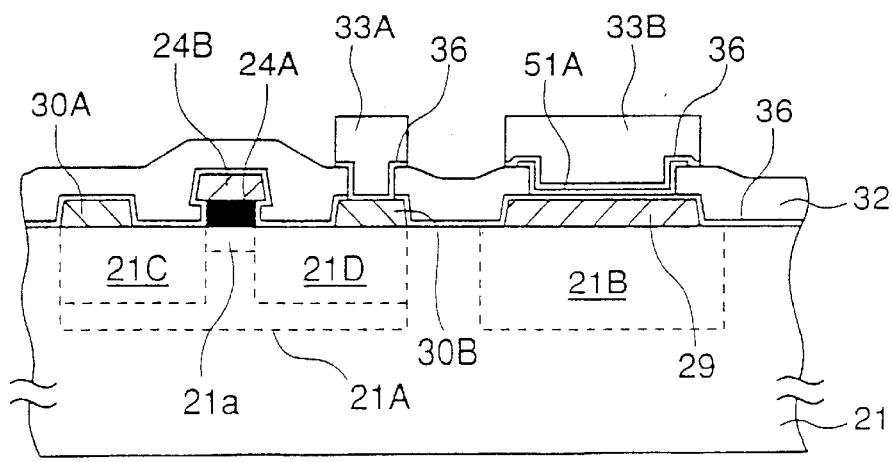

After the step of FIG. 6E, the resist pattern 37 is removed, and the exposed part of the Au layer 36 is removed by a dry etching process. As a result, there is formed an MMIC as represented in FIG. 6F.

In the present embodiment, it is possible to control the capacitance of the capacitor in conformity with the designed capacitance value by forming the capacitor dielectric film in the form of stacking of the SiN film 31 and the SiN film 51A. The process of the present embodiment is advantageous in the point that the variation of the capacitance value is compensated even in the case the dry etching process used at the time of forming the contact hole 32B has caused damaging or thinning in the SiN film 31, by providing the SiN film 51A.

In the embodiments described heretofore, it should be noted that the SiN film forming the capacitor insulation film may be replaced with an $SiO_2$ film or an SiON film.

Further, the present invention is not limited to the embodiments described heretofore, but various variations and modifications may be made without departing from the scope of the present invention.

What is claimed is:

1. A semiconductor device, comprising:
   a compound semiconductor substrate;
   a Schottky gate electrode formed on a first region of said compound semiconductor substrate with a first width;
   a low-resistance gate electrode formed on said Schottky gate electrode with a second, larger width, said low-resistance gate electrode forming, together with said Schottky gate electrode, a T-shaped gate electrode structure;
   a pair of ohmic electrodes making an ohmic contact with a surface of said compound semiconductor substrate in said first region at respective sides of said T-shaped gate electrode structure;
   a lower electrode pattern formed on a second region of said compound semiconductor substrate in direct contact with said surface of said compound semiconductor substrate, said lower electrode pattern having a composition substantially identical with a composition of said low-resistance gate electrode;
   a dielectric film formed on said lower electrode pattern; and
   an upper electrode pattern formed on said dielectric film,
   wherein said second region comprises a high-resistance region containing a p-type impurity element, and
   wherein said first region contains said p-type impurity element with a concentration level substantially identical with a concentration level of said p-type impurity element in said second region.

2. A semiconductor device as claimed in claim 1, wherein said first region includes a p-type well.

3. A semiconductor device as claimed in claim 1, wherein said lower electrode pattern comprises a Ti layer in contact with a surface of said compound semiconductor substrate at said second region and a low-resistance metal layer formed on said Ti layer.

4. A semiconductor device as claimed in claim 1, wherein said compound semiconductor substrate includes first and second diffusion regions of n-type respectively in alignment with a first sidewall of said Schottky gate electrode and a second, opposite side wall of said Schottky gate electrode.

5. A semiconductor device as claimed in claim 1, wherein said dielectric film constitutes a part of a passivation film of said semiconductor device.

6. A semiconductor device as claimed in claim 1, wherein said compound semiconductor substrate includes a high-resistance region extending from said second region, and wherein said high-resistance region carries thereon an interconnection pattern extending from said lower electrode pattern with a composition substantially identical with a composition of said lower electrode pattern.

7. A microwave integrated circuit, comprising:

a compound semiconductor substrate;

an active device formed in a first region of said compound semiconductor substrate;

a high-resistance part formed in a second, different region of said compound semiconductor substrate; and an interconnection pattern extending on the compound semiconductor substrate along said high-resistance part, said high-resistance part containing a p-type impurity element, said interconnection pattern comprising a Ti layer in contact with a surface of said compound semiconductor substrate directly and a low-resistance metal layer formed on said Ti layer.

* * * * *